United States Patent [19]

Mitsuhashi

[11] 4,266,872
[45] May 12, 1981

[54] METHOD OF MEASURING THE AMOUNT OF REDUCTION OF A DOT FILM, AND DEVICE FOR PRACTICING SAME

[75] Inventor: Yuuji Mitsuhashi, Fujisawa, Japan

[73] Assignee: Dai Nippon Insatsu Kabushiki Kaisha, Shinjuku, Japan

[21] Appl. No.: 28,195

[22] Filed: Apr. 9, 1979

[30] Foreign Application Priority Data

Apr. 11, 1978 [JP] Japan ................................. 53-42270

[51] Int. Cl.³ ..................... G01J 3/48; G01N 21/01; G01N 21/07
[52] U.S. Cl. ..................................... 356/51; 250/394; 356/244; 356/443
[58] Field of Search ................ 356/51, 320, 404, 407, 356/419, 443, 444, 244; 250/394

[56] References Cited

U.S. PATENT DOCUMENTS

| | | | |
|---|---|---|---|
| 3,306,156 | 2/1967 | Glasser et al. | 356/407 X |
| 3,586,441 | 6/1971 | Smith et al. | 356/320 |
| 3,827,808 | 8/1974 | Cho | 356/429 |
| 3,887,281 | 6/1975 | Kurita et al. | 356/419 X |
| 4,080,075 | 3/1978 | Berg | 356/443 |

Primary Examiner—Vincent P. McGraw
Attorney, Agent, or Firm—Koda and Androlia

[57] ABSTRACT

A dot film is irradiated by light, so that the quantity of light in the long wavelength region and the quantity of light in the short wavelength region are obtained from the light passed through the dot film. The amount of reduction of the dot film is calculated from the difference between the two quantities of light, and is displayed on a display section.

13 Claims, 18 Drawing Figures

METHOD OF MEASURING THE AMOUNT OF REDUCTION OF A DOT FILM, AND DEVICE FOR PRACTICING SAME

BACKGROUND OF THE INVENTION

This invention relates to a method of measuring the amount of reduction of a dot film such as a screen negative or a screen positive, and a device of practicing the same.

The dot film is obtained by subjecting an original to halftone photography, and the dot film is printed on an orginal plate to form a latent image. Then, the original plate is subjected to development to provide a press plate. It has been known from experience that it is impossible to obtain a satisfactory press plate directly from a dot film subjected to halftone photography. Before such a satisfactory press plate is obtained, it is necessary to print the dot film on a proofreading original plate thereby to form a press plate and then to carry out a proof. According to the result of this proof, the dot percentage of the dot film is adjusted.

Thereafter, a proofreading press plate is formed again to perform a proof. If the result of the proof is acceptable, then the dot film is printed on a printing original plate. If the result of the proof is not acceptable, then the dot percentage of the film is further adjusted, and a proof is carried out again.

The adjustment of the dot percentage of the dot film is carried out by the process of so-called "reduction". In this process, the size of the dots is reduced by washing the dot film with an iron chelate group reducer. The adjustment of the dot percentage depends completely on a retoucher's intuition. In other words, he has known through experience a suitable extent of reduction (or decrease of a dot percentage) for a desired printing result, and he performs the adjustment according to this knowledge.

The amount of reduction can be objectively obtained through measurements done with a dot percentage meter before and after the reduction. Therefore, the amount of reduction can be obtained even by an unskilled person. Accordingly, if the reduction is performed while the amount of reduction specified by the skilled retoucher is being measured with the dot percentage meter, then the reduction can be achieved even by the unskilled person, which leads to an improvement of the efficiency of the process of reduction.

A conventional dot percentage meter operates to measure the quantity of light passed through the portion other than dots of a dot film, thereby to calculate the amount of reduction. In general, the reduced portion of a dot film changes yellow-brown. Light is applied to this faded portion and to a transparent portion of the dot film where no dot is provided, and the quantities of light passed through the two different portions are converted into electrical data from which the dot percentage is calculated.

Figure 1:
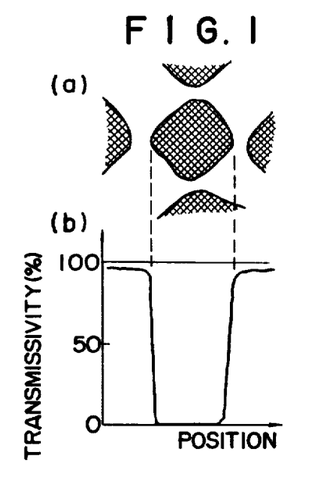
FIG. 1(a) is an explanatory diagram showing a dot before reduction.
FIG. 1(b) and FIG. 2(b) are graphical representations indicating light transmissivities before and after reduction.
Figure 2:
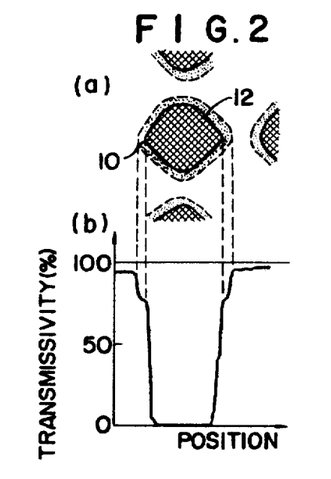
FIG. 2(a) is an explanatory diagram showing the dot after reduction.

The dots are as shown in FIG. 1(a), and they become as shown in FIG. 2(a) after reduction. In FIG. 2(a), the peripheral portion surrounding a dot 10 is a portion 12 subjected to reduction. The distribution of light transmissivity is affected by the reduction; more specifically, it is changed from the state shown in FIG. 1(b) to that shown in FIG. 2(b).

When the dot film is printed on an original plate or other films, the printing light can pass through the yellow-brown portion 12. Therefore, in measuring the dot percentage it is undesirable that the light transmissivity of the reduced portion 12 is varied.

An error in measurement due to the decrease of the dot percentage of the reduced portion may be prevented by employing a conventional method in which the shading of a dot film is converted into an electrical signal by means of, for instance, a vidicon to measure the area of a portion of the film where the density is higher than a predetermined value, thereby to measure the dot percentage.

However, a device for practicing this conventional method is bulky and expensive. In addition, even with the device, if the position of measurement before reduction is shifted from the position of measurement after reduction, then the amount of reduction measured includes a large amount of error. This error will be increased especially when a gradation portion is measured, due to the following reason: In the gradation portion, the size of a dot is different from the size of a dot adjacent thereto, and therefore the difference in light transmissivity due to the difference in size of dots is added to the difference in light transmissivity corresponding to the amount of reduction, when the position of measurement is changed.

Accordingly, in the conventional method it is necessary that the position of measurement before reduction strictly coincides with the position of measurement after reduction.

SUMMARY OF THE INVENTION

Accordingly, an object of this invention is to provide a method of measuring the amount of reduction of a dot film, in which even if the position of measurement is changed in measuring the amount of reduction, the accuracy of measurement is scarcely affected, whereby the measurement can be readily achieved in a short time, and to provide a device for practicing the method.

The foregoing object and other objects as well as the characteristic features of the present invention will become more apparent from the following detailed description and the appended claims when read in conjunction with the accompanying drawings.

DETAILED DESCRIPTION OF THE INVENTION

This invention bases on the fact that the amount of reduction is best represented by the above-described faded portion 12 of the dot film, and therefore it is the best way to measure the area of the faded portion 12 with some means.

Figure 3:
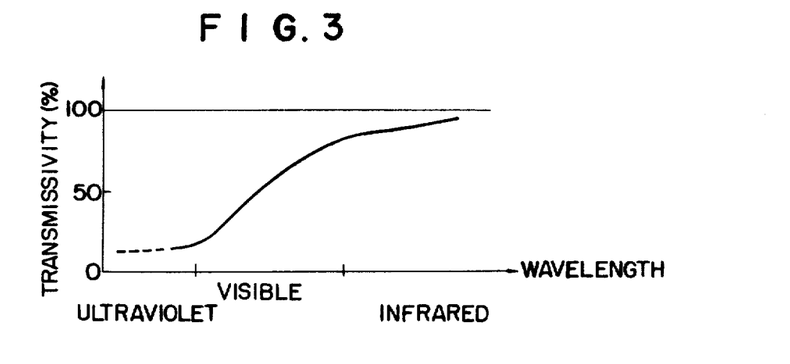
FIG. 3 is a graphical representation indicating the spectral transmission characteristic of the portion of a dot film subjected to reduction.

As a result of various investigations and studies made to measure the area of the faded portion, the inventors have found the following thing:

(1) The spectral transmission characteristic of the faded portion 12 is as indicated in FIG. 3. In the near ultraviolet region, the light transmissivity is low. In the visible region, the light transmissivity is increased as the optical wavelength is increased. In the near infrared region, the light transmissivity reaches the maximum value.

Figure 4:
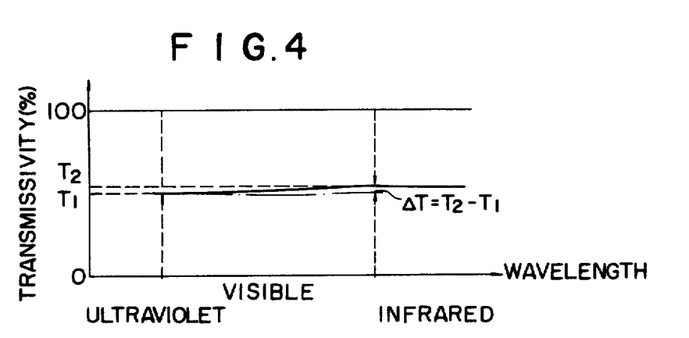
FIG. 4 is a graphical representation indicating the spectral transmission characteristic of a dot film subjected to reduction.

(2) The average spectral transmissivity of a dot film subjected to reduction is as shown in FIG. 4. This characteristic curve has been obtained by using the light which includes both light passed through an originally transparent portion between dots, and light passed through a yellow-brown but transparent portion formed by the reduction. It is apparent from FIG. 4 that the transmissivity $T_2$ of light in the near infrared wavelength region is clearly differentiated from the transmissivity $T_1$ of light in the near ultraviolet wavelength region even with a dot film by the effect of the light passed through the yellow-brown portion thereof.

$$(\Delta T = T_2 - T_1)$$

Figure 5:
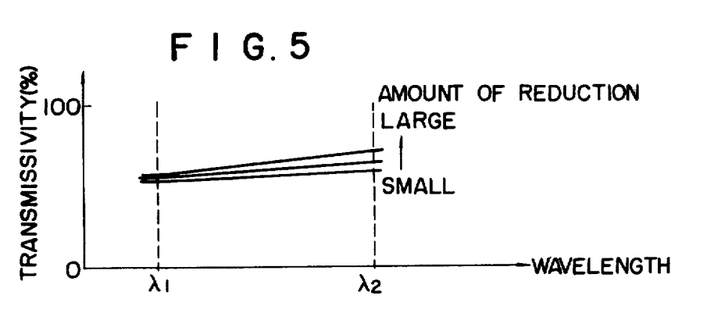
FIG. 5 is a graphical representation indicating the variations of a spectral transmissivity obtained when the amount of reduction is changed.
Figure 6:
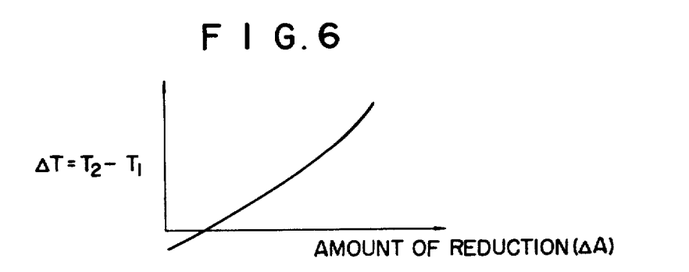
FIG. 6 is a graphical representation indicating the relation between an amount of reduction $\Delta A$ and a light transmissivity difference $\Delta T$.

(3) The amount of reduction can be approximated in proportional relation to the value $\Delta T$ (FIGS. 5 and 6).

Figure 7:
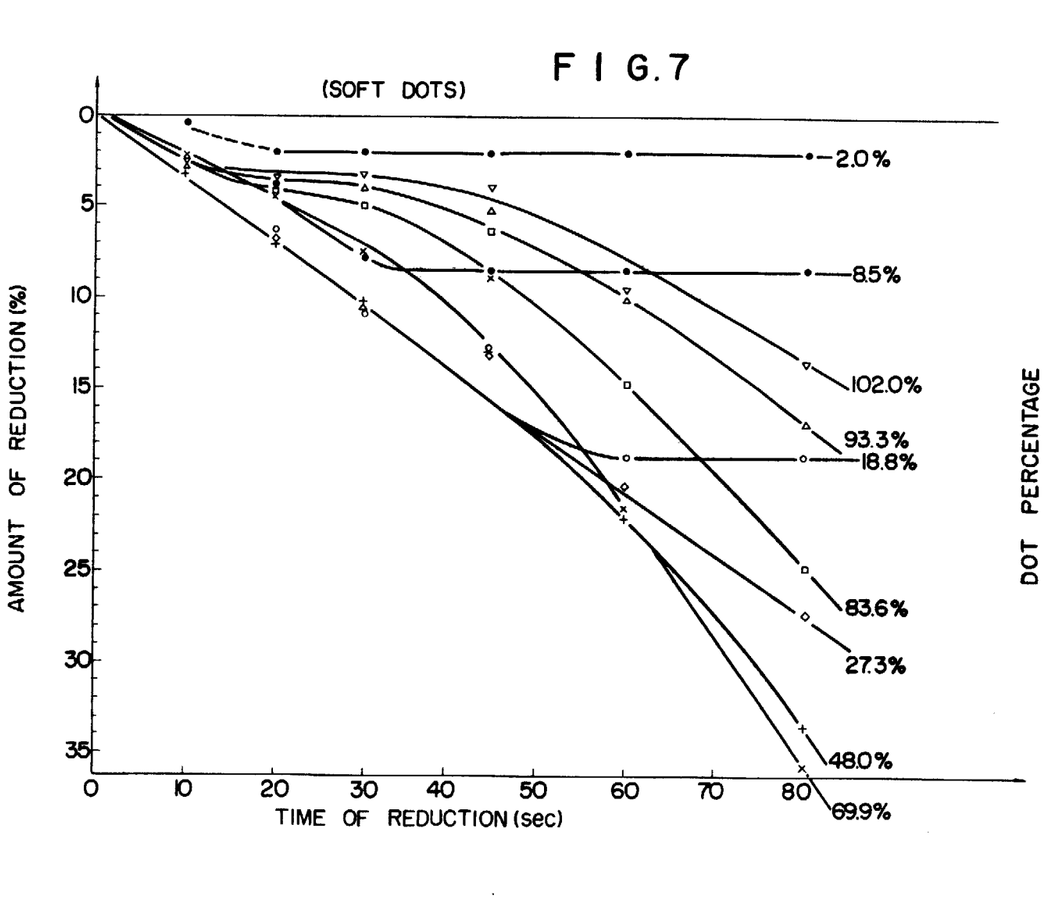
FIG. 7 and FIG. 8 are graphical representations indicating the relation between the time of reduction and a dot percentage (%)

(4) In the case where the dot is a soft dot, the amount of reduction is substantially unchanged if the dot percentage is from about 20% to about 60% and the time of reduction is the same (FIG. 7). This means that even if the position of measurement is somewhat shifted in the gradation portion, the measurement of the area of the yellow-brown portion is scarcely affected.

Figure 8:
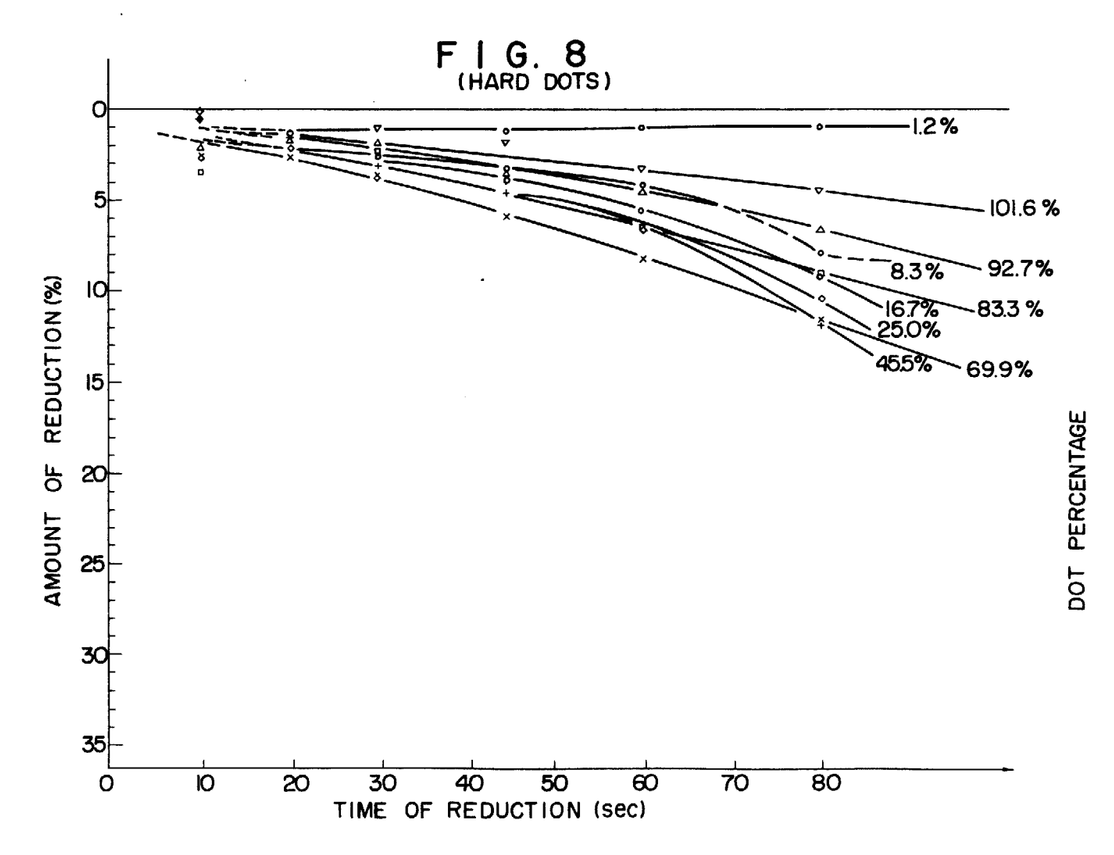

(5) In the case of hard dots, if the dot percentage is different, then the amount of reduction is different even if the time of reduction is the same. However, under the condition that the time of reduction is the same, the difference between the amounts of reduction is much less than the difference between the dot percentages (FIG. 8). For instance, in the case where the time of reduction is 80 seconds and the dot percentages are 25.0% and 45.5%, respectively, the difference between the two dot percentages is about 20%, but the difference between the amounts of reduction corresponding thereto is about 2%. Thus, it can be proved that even if the position of measurement is more or less shifted in the gradation portion, the measurement of the amount of reduction is not greatly affected.

Figures 9, 10, 11A:
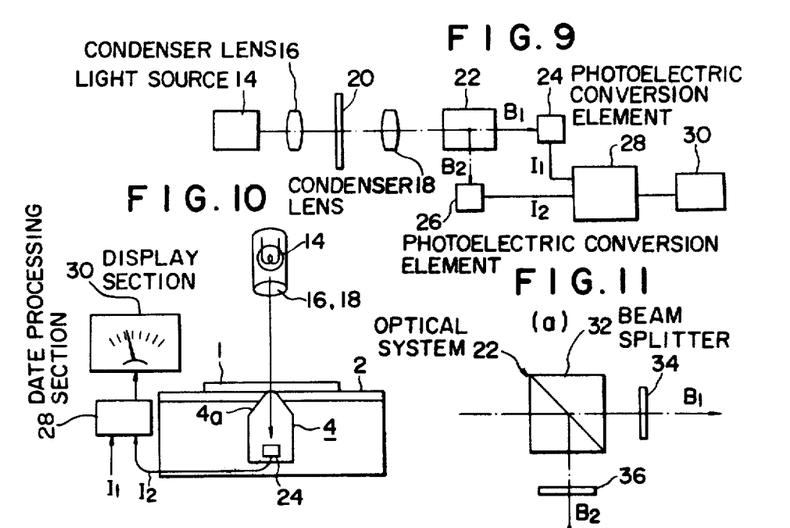
FIGS. 9, 14 and 15 are block diagrams showing various examples of a device for practicing a method of measuring the amount of reduction of a dot film according to this invention.
FIG. 10 is a diagram of the light receiving section of the device of FIG. 9.
FIGS. 11(a), 12(a) and 13 are explanatory diagrams showing different examples of an optical system of obtaining light beams in two optical wavelength regions.

FIG. 9 shows one example of a device for measuring the amount of reduction of a dot film, according to the invention. The device, as shown in FIG. 9 comprises: a light source 14; condenser lenses 16 and 18; an optical system 22 adapted to divide light from the light source into light $B_1$ in the above-described long wavelength region, preferably light in the near infrared wavelength region (including light near infrared rays in the visible light region), and light $B_2$ in the above-described short wavelength region, preferably light in the near ultraviolet wavelength region (including light near ultraviolet rays in the visible light region); photoelectric conversion elements 24 and 26 for extracting the quantities of light of the respective wavelength regions; a data processing section 28; and a display section 30. In FIG. 9, reference numeral 20 designates a specimen which is a screen positive film or a screen negative film.

It is required for the light source 14 that the spectral emission characteristic is stable and the quantity of light is scarcely changed with time, so that the measurement value is not affected by the variations of the quantity of light from the light source. Accordingly, a halogen lamp or a xenon lamp driven by a stabilized DC electric source is employed as the light source, for instance.

The light receiving section of the device shown in FIG. 9 is as illustrated in FIG. 10.

The light receiving section 4 is provided inside of a measuring table 2 (which is, in general, a light transmissive glass plate). The light source 14 is stationary disposed above the light receiving section 4 so that the light receiving section 4 can receive light from the light source 14. The light receiving section 4 comprises: a cylindrical head 4a opened at one end; and a light receiving element 24 such as a photoelectric conversion element adapted to receive light passed through an object 1 to be measured (which is the screen positive film or the screen negative film 20). The light receiving section 4 is arranged inside of the measuring table 2 in such a manner that the opening of the head 4a is flush with the upper surface of the measuring table 2. Accordingly, the lower surface of the object 1 placed on the table 2 is in close contact with the opening of the head 4a.

The light receiving element 24 is electrically connected through the data processing section 28 to the display section 30, so that the quantity of light passed through the object 1 and received by the light receiving section 4 is displayed on the display section 30.

With the device thus organized, the amount of reduction of the object 1 is measured as follows; First of all, a portion to be measured of the object is positioned on the opening of the head 4a. Then, light with a predetermined intensity is applied from the light source to the object 1 through the condenser lenses 16 and 18, so that the quantity of light passed through the object 1 is received by the light receiving element 24 and is displayed on the display section 30. Both of the light source 14 and the object 1 are exposed outside; that is, they are exposed to external light. Therefore, they are liable to be affected by the external light. In order to overcome this difficulty, infrared rays (or ultraviolet rays) other than visible light is employed as the light of the light source 14, an infrared filter is disposed in an optical path extended from the object 1 to the light receiving element 24 in the light receiving section in FIG. 10, and a silicon photo-diode capable of satisfactorily receiving infrared rays is employed as the light receiving element 24. In this case, it is possible to make the measurement free from influence in vision, and to avoid the effect of visible light in detecting ultraviolet rays.

In the above-described example, the opening of the light receiving section 4 is flush with the upper surface of the measuring table 2; however, the light receiving section 4 may be so modified that the opening thereof is in close contact with the lower surface of the measuring table 2.

Figure 12A:
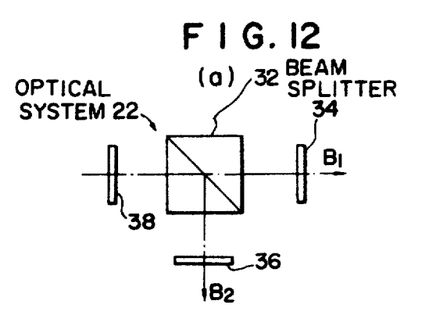
Figure 13:
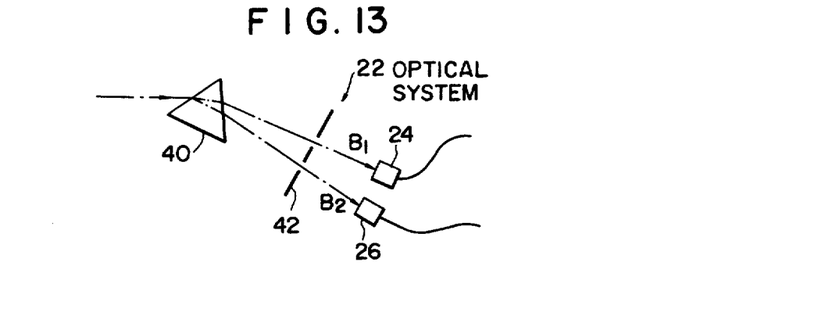

The above-described optical system 22 operating to divide light into the lights $B_1$ and $B_2$ in two different wavelength regions may be constructed as shown in FIG. 11, 12 or 13.

Figure 11B:
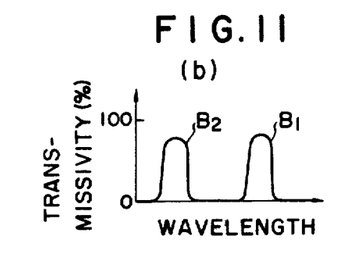
FIGS. 11(b), 12(b) and 12(c) are graphical representations indicating the relation between the wavelength of light passing through the optical system and the light transmissivity thereof.

Referring to FIG. 11, reference numeral 32 designates a beam splitter, and reference numerals 34 and 36 designate filters. The filter 34 is adapted to extract the light $B_1$ in the near infrared wavelength region from the light of the light source, and the filter 36 is adapted to extract the light $B_2$ in the near ultraviolet wavelength region (the part (b) of FIG. 11).

Figure 12B:
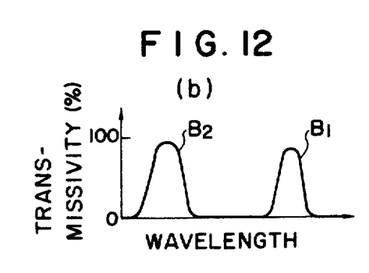
Figure 12C:
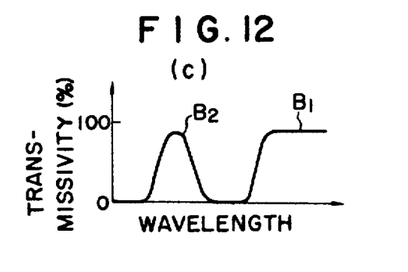

In the optical system shown in FIG. 12, another filter 38 is additionally provided on the side of the light source, so as to pass the lights $B_1$ and $B_2$ in the two wavelength regions, as shown in the part (b) of FIG. 12. The wavelength characteristic of the beam filter 32 is relatively flat. Two light beams are allowed to leave the beam splitter 32. In this case, each light beam is allowed to leave the beam splitter 32 with the other light beam in the other wavelength region cut. Thus, the light beams are converted into light beams $B_1$ and $B_2$ in wavelength regions as shown in the part (c) of FIG. 12, which are applied to the different photoelectric conversion elements 24 and 26, respectively. These elements may be sensible for the respective wavelength light beams.

In the optical system shown in FIG. 13, a prims 40 is employed instead of the above-described beam splitter and filters. In FIG. 13, reference numeral 42 designates a slitter, and reference numeral 24 and 26 designate photoelectric conversion elements for receiving light beams $B_1$ and $B_2$ separated by the slitter 42, respectively.

Instead of the above-described optical systems, an optical system may be used in which a dichroic mirror is employed as a beam splitter to selectively pass or reflect two light beams according to the wavelength regions, thereby to permit the two light beams to advance in two different optical paths. In addition, a grating may be used instead of the prism.

The aforementioned data processing section 28 is to calculate the amount of reduction from electrical data obtained by converting the quantities of light beams $B_1$ and $B_2$ in two different wavelength regions with the photoelectric conversion elements 24 and 26.

In this data processing circuit 28, first a film having a dot percentage 0 (or a film not reduced yet) is used as a specimen, and electrical data $I_3$ and $I_4$ obtained by receiving the quantities of transmission light beams $B_1$ and $B_2$ in the respective optical wavelength regions with the photoelectric conversion elements are stored. Then, a dot film reduced is used as a specimen, and electrical data $I_1$ and $I_2$ corresponding to the quantities of transmission light beams $B_1$ and $B_2$ in the optical wavelength regions are obtained, to conduct the following calculation:

$$\Delta T = \left( \frac{I_1}{I_3} - \frac{I_2}{I_4} \right) \times 100 \, (\%)$$

Then, the next calculation is carried out to approximate the value $\Delta T'$ in proportional relation to the amount of reduction $\Delta A$:

$$\Delta A = a + K \Delta T$$

where K is the constant which is of the order of 2 to 2.5 in the case where the wavelength regions of the light beams $B_1$ and $B_2$ are selected to be the near infrared wavelength region and the near ultraviolet wavelength regions, respectively, and a is approximately 1 to 2.

If the relation between the values $\Delta A$ and $\Delta T'$ is approximated by a function having a degree of two or higher, then the value $\Delta A$ can be obtained with higher accuracy.

The value $\Delta A$ is displayed as digital or analog data on the display section.

If the surface of a specimen is dry, then interference is caused by light reflected by the surface, as a result of which the spectral transmissivity is affected. However, if the surface of the specimen is wetted with transparent liquid and is then brought into close contact with a transparent plate for measurement, then the quantity of light reflected thereby is reduced, while results in an improvement of the measurement accuracy.

The effect to the spectral transmissivity of the interference of light reflected by the surface of a film may be prevented by a method in which the wavelength band width of a transmissivity to be measured is increased thereby to average the fluctuation of spectral transmissivity due to the interference of light. In this method, it is essential that the light source has a relatively continuous spectral emission characteristic in each wavelength region to be measured and has no intensive bright line spectrum.

Figure 14:
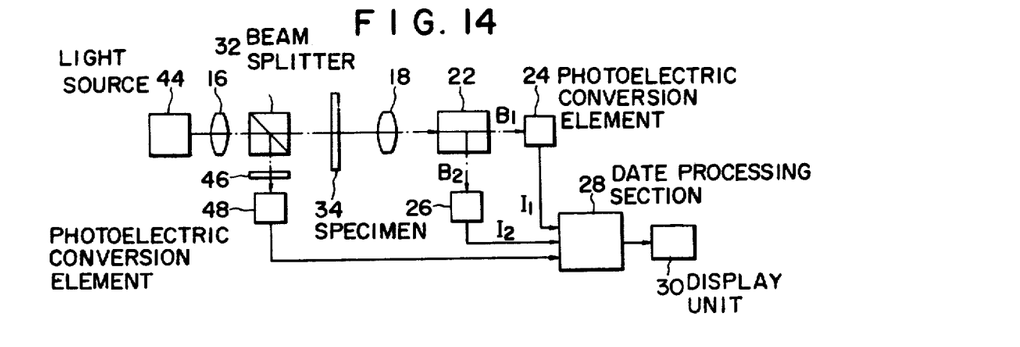

Shown in FIG. 14 is another example of the device for measuring the amount of reduction according to the invention, which is employed in the case where the quantity of light from the light source is varied with time, but the spectral emission characteristic is relatively stable.

In FIG. 14, reference numeral 44 designates a light source which is a xenon lamp. A beam splitter 32 is disposed between the light source 44 and a specimen 34. A filter 46 and a photoelectric conversion element 48 are disposed in an optical path extended from the beam splitter 32.

The filter is capable of passing all of the wavelength regions of light from the light source, or only a certain wavelength region.

In this example, the light from the light source 44 is divided into two light beams advancing along two optical paths by the beam splitter. The light beam in one of the two optical paths is applied to the specimen 34, and the light beam passed through the specimen 34 is divided into the light $B_1$ in the near infrared wavelength region and the light $B_2$ in the near ultraviolet wavelength region by an optical system 22, and the quantities of the lights $B_1$ and $B_2$ are obtained as electrical data by the photoelectric conversion elements 24 and 26.

On the other hand, the quantity of the light beam in the other optical path is outputted as electrical data by the photoelectric conversion element 48.

In a calculating circuit, the following equation is calculated:

$$\Delta T' = \frac{L}{L_o}\left(\frac{I_1}{I_3} - \frac{I_2}{I_4}\right) \times 100$$

where $L_o$, $I_3$ and $I_4$ are the electrical data proportional to the quantity of the light in the optical path branched by the beam splitter when a film having a dot percentage 0 is used as the specimen, and the electrical data proportional to the quantities of the lights $B_1$ and $B_2$ in the respective wavelength regions, and L, $I_1$ and $I_2$ are the electrical data proportional to the above-described quantities of light when a dot film reduced is used as the specimen. Thereafter, the value $\Delta A$ is obtained, and displayed on the display section.

Figure 15:
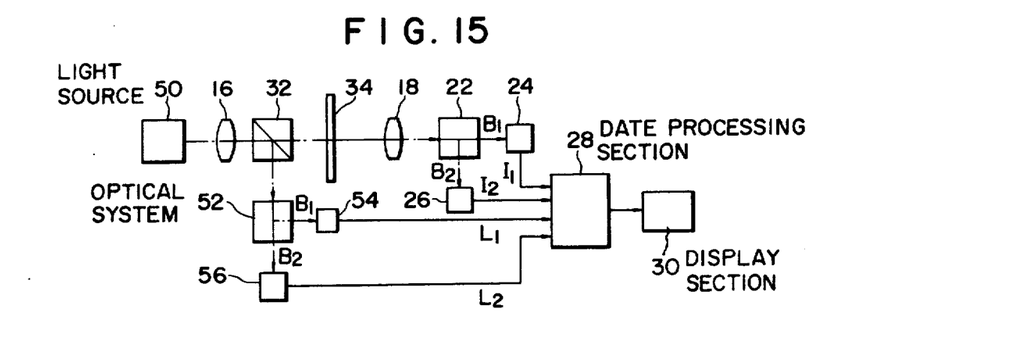

Shown in FIG. 15 is a third example of the device for measuring the amount of reduction according to the invention, which is employed in the case where the quantity of light from the light source is varied with time and the spectral emission characteristic is unstable.

In FIG. 15, reference numeral 50 designates a light source, and in the other optical path referred to in FIG. 14 an additional optical system 52 and photoelectric conversion elements 54 and 56 are provided. By the provision of the optical system 52, the quantities of light corresponding to those of the lights $B_1$ and $B_2$ in the near infrared wavelength region and the near ultraviolet wavelength region are extracted as electrical data $L_1$ and $L_2$ from the light in said other optical path. The electrical data are employed as reference values in the data processing section 28, where they are compared with the electrical data $I_1$ and $I_2$ corresponding to the lights in the wavelength regions which are obtained from said one optical path, so that the difference $\Delta T'$ is calculated, and then the amount of reduction $\Delta A$ is calculated. The value $\Delta A$ is displayed on the display section 30, so as to be informed to the retoucher.

In any of the above-described example, a fluorescent lamp emitting a large amount of ultraviolet rays in combination with a tungsten lamp or the like emitting a large amount of infrared rays can be used as the light source (14, 44 or 50).

The two wavelength regions to be detected are not limited to the near ultraviolet and near infrared wavelength regions. However, as is apparent from FIG. 3, it is advisable to limit the two wavelength regions to be detected to the near ultraviolet and near infrared wavelength resions, because the value $\Delta T'$ can be readily measured.

The above-described data processing section 28 is constituted by an analog computer or a digital computer. In the case of the device shown in FIG. 1, the data processing section operates to calculate the following equation $$\Delta T = \left(C_1 \times \frac{I_1}{L_1} - C_2 \frac{I_2}{L_2}\right) \times 100$$

and to calculate the approximate value $\Delta A'$ of the amount of reduction by the following equation:

$$\Delta A' = a + K\Delta T, \text{ or}$$

$$\Delta A' = K_0 + K_1\Delta T + K_2(\Delta T)^2$$

In the above equation, $C_1$ and $C_2$ are the constants for correction the amounts of attenuation of the quantities of light in the respective optical paths, and are obtained from the following equations by utilizing the values $L_1$, $L_2$, $I_1$ and $I_2$ when a film having a dot percentage 0 is used as the specimen:

$$C_1 = L_1/I_1$$

$$C_2 = L_2/I_2$$

As is apparent from the above description, according to the invention, the area of a portion changed yellow-brown by reduction can be measured, and therefore the amount of reduction can be measured more precisely.

In the case of soft dots, the amount of reduction of the portion changed yellow-brown is scarcely changed if the time of reduction is the same, even though the dot percentage has been greatly changed. Therefore, even if the position of measurement is somewhat shifted before and after the reduction in measuring the amount of reduction of a gradated portion, the measurement can be achieved with high accuracy. This means that the measurement can be achieved readily in a short time.

If, even in the case of hard dots, the time of reduction is the same, the difference in area of the portion changed yellow is smaller than the difference of dot percentage. Therefore, even if the position of measurement is somewhat shifted in the gradated portion, the measurement can be achieved with high accuracy similarly as in the above-described case.

What is claimed is:

1. A method of measuring the amount of reduction of a dot film, comprising the steps of:
   reducing a dot film with reducer;
   applying light to reduced portion of the dot film;
   extracting two quantities of light in light including a relatively large amount of ultraviolet rays and in light including a relatively large amount of infrared rays from light which passed through said dot film;
   calculating differences between said quantities of light; and
   displaying the amount of reduction which calculated from said differences.

2. A method of measuring the amount of reduction of a dot film according to claim 1, wherein the extracting step is carried out by permitting the light which passed through said dot film to pass through a beam splitter and filters so as to be divided into light beam in said two wavelength regions, which are applied to photoelectric conversion elements, respectively.

3. A method of measuring the amount of reduction of a dot film according to claim 1, wherein the extracting step is carried out by permitting the light which passed through said dot film to pass through a prism and a slit so as to be divided into light beams in said two wavelength regions, which are applied to photoelectric conversion elements, respectively.

4. A method of measuring the amount of reduction of a dot film according to claim 1, wherein the difference between said quantities of light is approximated in proportional relation to the amount of reduction, and said amount of reduction is calculated by multiplying the difference between said quantities of light by a constant.

5. A method of measuring the amount of reduction of a dot film according to claim 1, wherein the relation between the difference between said quantities of light and the amount of reduction is approximated by a linear function.

6. A method of measuring the amount of reduction of a dot film according to claim 1, wherein the relation between the difference between said quantities of light and the amount of reduction is approximated by a quadratic function.

7. A method of measuring the amount of reduction of a dot film, comprising the steps of:
dividing light from a light source into first light advancing along a first optical path and second light advancing along a second optical path;
applying said first light to the dot film;
extracting two quantities of light in light including a relatively large amount of ultraviolet rays and in light including a relatively large amount of infrared rays from light which passed through said dot film;
calculating the amount of reduction from the difference between said two quantities of light;
simultaneously employing the quantity of light, concerning all of the wavelength regions or a desired wavelength region of said light source, in said second optical path as a reference value for comparison; and
displaying the amount of reduction.

8. A method of measuring the amount of reduction of a dot film according to claim 7, wherein the extracting step is carried out by permitting the light which passed through said dot film to pass through a beam splitter and filters so as to be divided into light beams in said two wavelength regions, which are applied to photoelectric conversion elements, respectively.

9. A method of measuring the amount of reduction of a dot film according to claim 7, wherein the extracting step is carried out by permitting the light which passed through said dot film to pass through a prism and a slit so as to be divided into light beams in said two wavelength regions, which are applied to photoelectric conversion elements, respectively.

10. A method of measuring the amount of reduction of a dot rilm according to claim 7, wherein the difference between said quantities of light is approximated in proportional relation to the amount of reduction, and said amount of reduction is calculated by multiplying the difference between said quantities of light by a constant.

11. A method of measuring the amount of reduction of a dot film according to claim 7, wherein the relation between the difference between said quantities of light and the amount of reduction is approximated by a linear function.

12. A method of measuring the amount of reduction of a dot film according to claim 7, wherein the relation between the difference between said quantities of light and the amount of reduction is approximated by a quadratic function.

13. A device for measuring the amount of reduction of a dot film, which comprises:
a cylindrical light receiving means having an opening which is flush with the upper surface of a measuring table, said light receiving means being disposed inside of said measuring table; and
a light emitting means adapted to emit light to an object to be measured which is placed on said measuring table, said light emitting means confronting said light receiving means, whereby the amount of reduction of said object is determined from the quantity of light which passed through said object.

* * * * *